United States Patent
Carreto et al.

(10) Patent No.: US 7,307,477 B2
(45) Date of Patent: Dec. 11, 2007

(54) APPARATUS AND METHOD FOR AFFECTING OPERATION OF A SIGNAL TREATING DEVICE

(75) Inventors: Maria-Flora Carreto, Richardson, TX (US); Charles Parkhurst, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 11/349,861

(22) Filed: Feb. 8, 2006

(65) Prior Publication Data

US 2007/0194851 A1    Aug. 23, 2007

(51) Int. Cl.
*H03F 3/45* (2006.01)
(52) U.S. Cl. ..................... 330/261; 330/296
(58) Field of Classification Search ............... 330/261, 330/257, 252, 285, 296
See application file for complete search history.

(56) References Cited

U.S. PATENT DOCUMENTS

| | | | | |
|---|---|---|---|---|
| 4,668,919 A | * | 5/1987 | de Weck | 330/253 |
| 5,576,656 A | * | 11/1996 | McClure | 327/538 |
| 6,310,512 B1 | * | 10/2001 | Briskin et al. | 327/552 |
| 6,710,654 B2 | | 3/2004 | Parkhurst et al. | |
| 2004/0212425 A1 | | 10/2004 | Parkhurst | |

OTHER PUBLICATIONS

Johan H. Huijsing and Daniel Linebarger; "Low-Voltage Operational Amplifier with Rail-to-Rail Input and Output Ranges;" IEEE Journal of Solid-State Circuits; vol. SC-20, No. 6; Dec. 1985.

* cited by examiner

*Primary Examiner*—Henry Choe
(74) *Attorney, Agent, or Firm*—Wade J. Brady, III; Frederick J. Telecky, Jr.

(57) ABSTRACT

An apparatus for affecting operation of a signal treating device that is provided an operating voltage ranging between an upper voltage limit and a lower voltage limit for treating at least one input signal includes: a respective dynamic bias unit coupled with the signal treating device for each respective input signal of the at least one input signal; and a respective transconductance control unit coupled with each the respective dynamic bias unit. Each respective dynamic bias unit and transconductance control unit cooperates to operate the signal treating device responsive to the at least one input signal approaching at least one of the upper voltage limit and the lower voltage limit.

20 Claims, 5 Drawing Sheets

APPARATUS AND METHOD FOR AFFECTING OPERATION OF A SIGNAL TREATING DEVICE

BACKGROUND OF THE INVENTION

The present invention is directed to signal treating devices, such as by way of example and not by way of limitation signal amplifiers, and especially to signal treating devices capable of utilizing substantially all of a supply-voltage range for input and output signal operations. Such use of substantially all of a supply-voltage range is sometimes described as rail-to-rail operation.

Constancy of transconductance ($g_m$) over an operating range is important to ensure consistency of performance for a signal treating device, such as by way of example and not by way of limitation an operational amplifier.

In today's marketplace one encounters signal treating devices such as signal amplifiers and differential signal amplifiers that are provided a supply-voltage range on the order of, for example, 2.7 volts or 3 volts. It is desirable that such signal treating devices be able to effect rail-to-rail operation so that signal-to-noise ratio may be maximized while maintaining a substantially constant transconductance ($g_m$) over an operating voltage range.

SUMMARY OF THE INVENTION

An apparatus for affecting operation of a signal treating device that is provided an operating voltage ranging between an upper voltage limit and a lower voltage limit for treating at least one input signal includes: a respective dynamic bias unit coupled with the signal treating device for each respective input signal of the at least one input signal; and a respective transconductance control unit coupled with each the respective dynamic bias unit. Each respective dynamic bias unit and transconductance control unit cooperates to operate the signal treating device responsive to the at least one input signal approaching at least one of the upper voltage limit and the lower voltage limit.

A method for affecting operation of a signal treating device that is provided an operating voltage ranging between an upper voltage limit and a lower voltage limit for treating at least one input signal includes the steps of: (a) in no particular order: (1) providing a respective dynamic bias unit coupled with the signal treating device for each respective input signal of the at least one input signal; and (2) providing a respective transconductance control unit coupled with each respective dynamic bias unit. (b) operating each respective dynamic bias unit and each transconductance control unit cooperatively to operate the signal treating device responsive to the at least one input signal approaching at least one of the upper voltage limit and the lower voltage limit.

It is, therefore, an object of the present invention to provide a signal treating device capable of substantially rail-to-rail operation while maintaining a substantially constant transconductance ($g_m$) over an operating range.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

The term "locus" is intended herein to indicate a place, location, locality, locale, point, position, site, spot, volume, juncture, junction or other identifiable location-related zone in one or more dimensions. A locus in a physical apparatus may include, by way of example and not by way of limitation, a corner, intersection, curve, line, area, plane, volume or a portion of any of those features. A locus in an electrical apparatus may include, by way of example and not by way of limitation, a terminal, wire, circuit, circuit trace, circuit board, wiring board, pin, connector, component, collection of components, sub-component or other identifiable location-related area in one or more dimensions.

Figure 1:
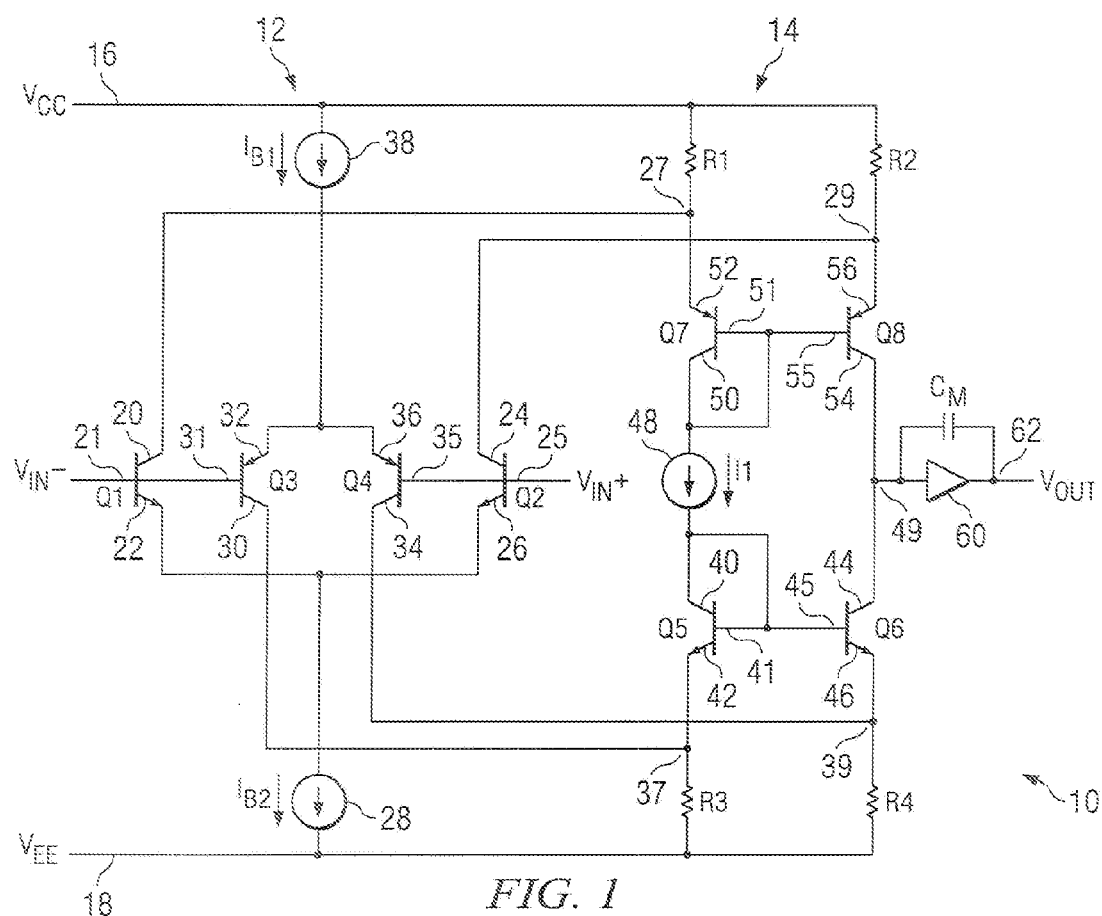
FIG. 1 is an electrical schematic diagram illustrating a representative prior art attempt at providing a signal treating device capable of rail-to-rail operation.

FIG. 1 is an electrical schematic diagram illustrating a representative prior art attempt at providing a signal treating device capable of rail-to-rail operation. In FIG. 1, an input device 10 includes a complementary input stage 12 and a summing circuit 14 supplied for differential signal processing. Input device 10 is coupled between an upper supply voltage line or rail 16 and a lower supply voltage line or rail 18. Upper supply voltage line 16 provides an upper supply voltage $V_{CC}$. Lower supply voltage line 16 provides a lower supply voltage $V_{EE}$.

Complementary input stage 12 includes a NPN transistor pair Q1, Q2. NPN transistor Q1 has a collector 20, a base 21 and an emitter 22. NPN transistor Q2 has a collector 24, a base 25 and an emitter 26. Complementary input stage 12 also includes a PNP transistor pair Q3, Q4. PNP transistor Q3 has a collector 30, a base 31 and an emitter 32. PNP transistor Q4 has a collector 34, a base 35 and an emitter 36. Transistor pair Q1, Q2 is coupled with lower voltage supply line 18 by emitters 22, 26 and a current source 28. Current source 28 provides a tail current $I_{B2}$. Transistor pair Q3, Q4 is coupled with upper voltage supply line 16 by collectors 32, 36 and a current source 38. Current source 38 provides a tail current $I_{B1}$. Bases 21, 31 are commonly coupled for receiving an input signal $V_{IN}-$. Bases 25, 35 are commonly coupled for receiving an input signal $V_{IN}+$. Collectors 20, 24, 30, 34 are coupled with summing circuit 14.

Collector currents from collectors 20, 24, 30, 34 are summed by four transistors Q5, Q6, Q7, Q8 coupled in a folded cascode arrangement to present a single output current at an output locus 49. Summing circuit 14 includes NPN transistor pair Q5, Q6. NPN transistor Q5 has a collector 40, a base 41 and an emitter 42. NPN transistor Q6 has a collector 44, a base 45 and an emitter 46. Summing circuit 14 also includes PNP transistor pair Q7, Q8. PNP transistor Q7 has a collector 50, a base 51 and an emitter 52. PNP transistor Q8 has a collector 54, a base 55 and an emitter 56. Transistor Q5 is coupled with lower voltage supply line 18 by emitter 42 and a resistor R3. Transistor Q6 is coupled with lower voltage supply line 18 by emitter 46 and a resistor R4. Transistor Q7 is coupled with upper voltage supply line 16 by emitter 52 and a resistor R1. Transistor Q8 is coupled with upper voltage supply line 16 by emitter 56 and a resistor R2. A current source 48 is coupled between collector 50 and collector 40. Collector 54 is coupled with collector 44.

Bases 51, 55 are coupled together and with collector 50 thereby effecting diode coupling of transistor Q7. Bases 41, 45 are coupled together and with collector 40 thereby effecting diode coupling of transistor Q5. Collector 20 of transistor Q1 is coupled with a locus 27 in common with resistor R1 and emitter 52 of transistor Q7. Collector 24 of transistor Q2 is coupled with a locus 29 in common with resistor R2 and emitter 56 of transistor Q8. Collector 30 of transistor Q3 is coupled with a locus 37 in common with resistor R3 and emitter 42 of transistor Q5. Collector 34 of transistor Q4 is coupled with a locus 39 in common with resistor R4 and emitter 46 of transistor Q6. An output current is provided from output locus 49 to an amplifier device 60. Amplifier device 60 has a capacitor $C_M$ coupled in parallel and provides an output signal $V_{OUT}$ at an output locus 62.

Operation of input device 10 is described in: Johan H. Huijsing and Daniel Linebarger, "Low-Voltage Operational Amplifier with Rail-to-Rail Input and Output Ranges"; IEEE Journal of Solid State Circuits, Vol. SC-20, No. 6, December 1985. The input signal level for differential pair NPN transistors Q1, Q2 can reach upper supply voltage $V_{CC}$ provided that voltage drop across resistors R1, R2 does not cause significant saturation of transistors Q1, Q2. Similarly, the input signal level for differential pair PNP transistors Q3, Q4 can reach lower supply voltage $V_{EE}$ provided that voltage drop across resistors R3, R4 does not cause significant saturation of transistors Q3, Q4.

There are three common-mode voltage ranges that can be distinguished with respect to input device 10:

(1) In the range from lower supply voltage $V_{EE}$ to a voltage ($V_{EE}+V_{be}$), only differential pair PNP transistors Q3, Q4 are operating. $V_{be}$ is the base-to-emitter voltage of one of transistors Q1, Q2, Q3, Q4.

(2) In the range from upper supply voltage $V_{CC}$ to a voltage ($V_{CC}-V_{be}$), only differential pair NPN transistors Q1, Q2 are operating.

(3) In the intermediate range between voltages ($V_{EE}+V_{CC}$), ($V_{CC}-V_{be}$), all of transistors Q1, Q2, Q3, Q4 are operating.

Additional circuitry is required to achieve a constant transconductance ($g_m$) over the full common mode range of complementary differential pairs (Q1, Q2), (Q3, Q4). It is desirable to have constant $g_m$ over the full common mode range to achieve better performance exhibiting less distortion over the full common mode range.

Figure 2:
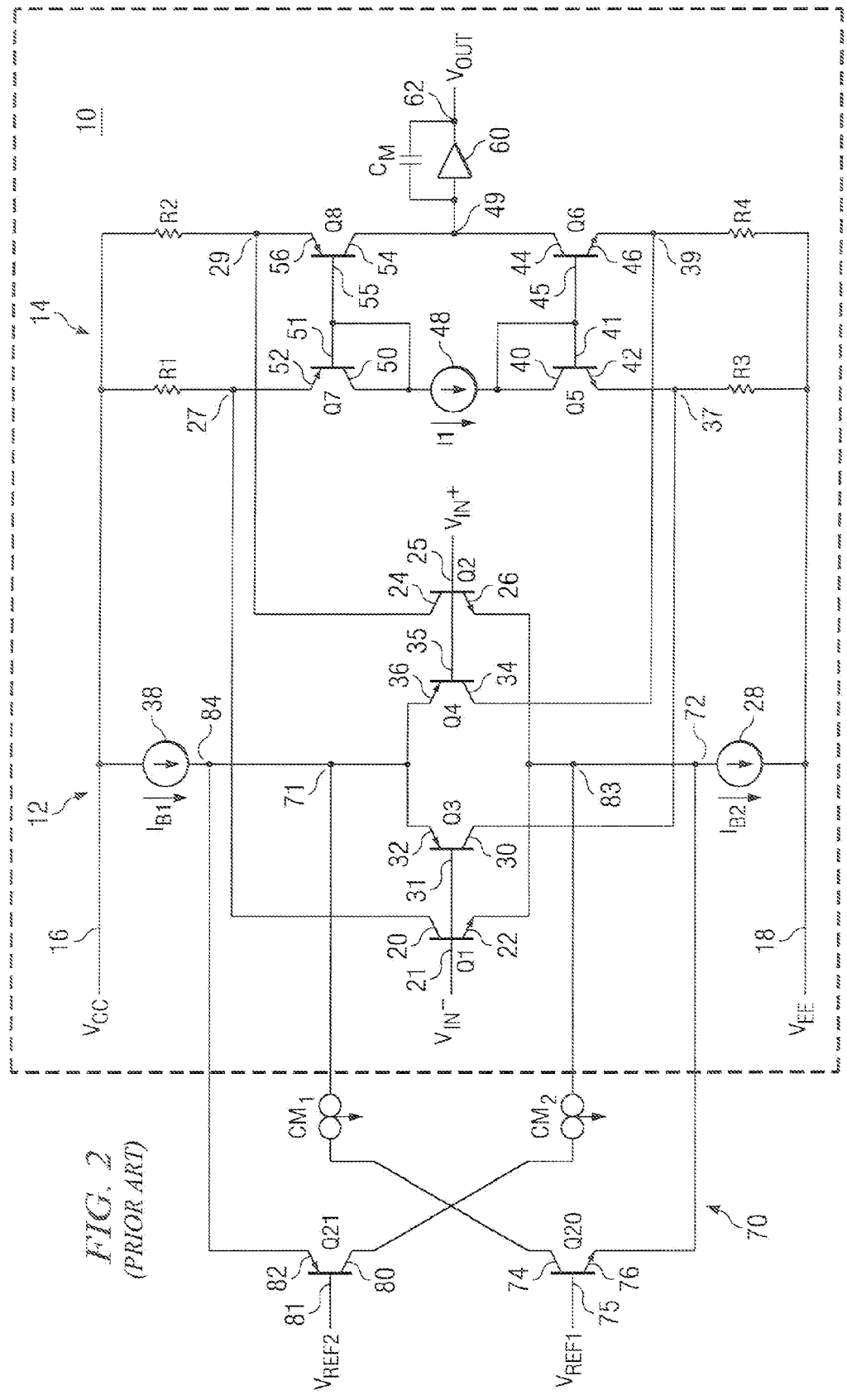
FIG. 2 is an electrical schematic diagram illustrating a representative prior art circuit providing transconductance control using a current steering technique.

FIG. 2 is an electrical schematic diagram illustrating a representative prior art circuit providing transconductance control using a current steering technique. In FIG. 2, a transconductance control unit 70 is illustrated in coupled relation with a representative input device 10 (FIG. 1). Input device 10 is described in detail in connection with FIG. 1 above and, in the interest of avoiding prolixity, that description will not be repeated here.

Transconductance control unit 70 includes a first current mirror CM1 and an NPN transistor Q20 coupled between a locus 71 adjacent to emitters 32, 36 of transistors Q3, Q4 and a locus 72 located adjacent emitters 22, 26 of transistors Q1, Q2. Transistor Q20 has a collector 74, a base 75 and an emitter 76. Collector 74 is coupled with current mirror CM1. Emitter 76 is coupled with locus 72. Base 75 is coupled to receive a reference voltage $V_{REF1}$. Transconductance control unit 70 also includes a second current mirror CM2 and a PNP transistor Q21 coupled between a locus 83 adjacent to emitters 22, 26 of transistors Q1, Q2 and a locus 84 located adjacent emitters 32, 36 of transistors Q3, Q4. Transistor Q21 has a collector 80, a base 81 and an emitter 82. Collector 80 is coupled with current mirror CM2. Emitter 82 is coupled with locus 84. Base 81 is coupled to receive a reference voltage $V_{REF2}$.

Transconductance control unit 70 is sometimes referred to as a current steering device. Current steering devices are described in Johan H. Huijsing, *Operational Amplifiers, Theory and Design*; Kluwer Academic Publishers; Boston; 2001; pp. 102-106. When only one of transistor pairs Q1, Q2 or Q3, Q4 is operating, an appropriate one of transistors Q20, Q21 will turn on and effect a steering of one of tail currents $I_{B1}$, $I_{B2}$ through one of current mirrors CM1, CM2. As a result, when only one pair of transistors Q1, Q2 or Q3, Q4 is active, the active transistor-pair is biased with substantially twice the tail current that is extant when both transistor-pairs Q1, Q2 or Q3, Q4 are active. The result is that substantially constant transconductance ($g_m$) is present for input device 10 whether one or both of transistor-pairs Q1, Q2 and Q3, Q4 are operating.

One limitation of complementary differential pairs, such as transistor pairs Q1, Q2 and Q3, Q4 is that they operate in Class A and therefore the slew rate in the intermediate operating range is given by:

$$SR = \frac{dV_{OUT}}{dt} = \frac{2I_B}{C_C} \quad [1]$$

Where, $I_B$ is the tail current of each differential pair; and
$C_C$ is compensation capacitance.

It may be presumed that $I_B=I_{B1}=I_{B2}$. Compensation capacitance $C_C$ is also considered to include parasitic capacitance associated with the circuitry including the complementary pairs. The slew rate SR is multiplied by 2 because both differential pairs Q1, Q2 and Q3, Q4 are operating in parallel in the mid-range.

Since the output stage must also be rail-to-rail to maximize the dynamic range for low voltage applications (i.e., when $V_{CC}-V_{EE}$ is a low value), Miller compensation is required so that compensation capacitance $C_C$ is determined by:

$$C_C = A_{V2} \cdot C_M \quad [2]$$

Where, $A_{V2}$ is the voltage gain of the output stage 10; and
$C_M$ is the Miller capacitance.

As one may observe by expressions [1] and [2], in order to obtain high slew rates, either tail current $I_B$ can be increased or compensation capacitance $C_C$ may be decreased. Decreasing compensation capacitance $C_C$ is not advisable because that would contribute to instability. Another way to increase slew rate is to use degeneration for the emitter-coupled differential pairs Q1, Q2 and Q3, Q4, which in turn reduces transconductance $g_m$ of the first stage and therefore transistor-pairs Q1, Q2 and Q3, Q4 require lower compensation. A drawback is that noise increases when this alternative approach is used.

Figure 3:
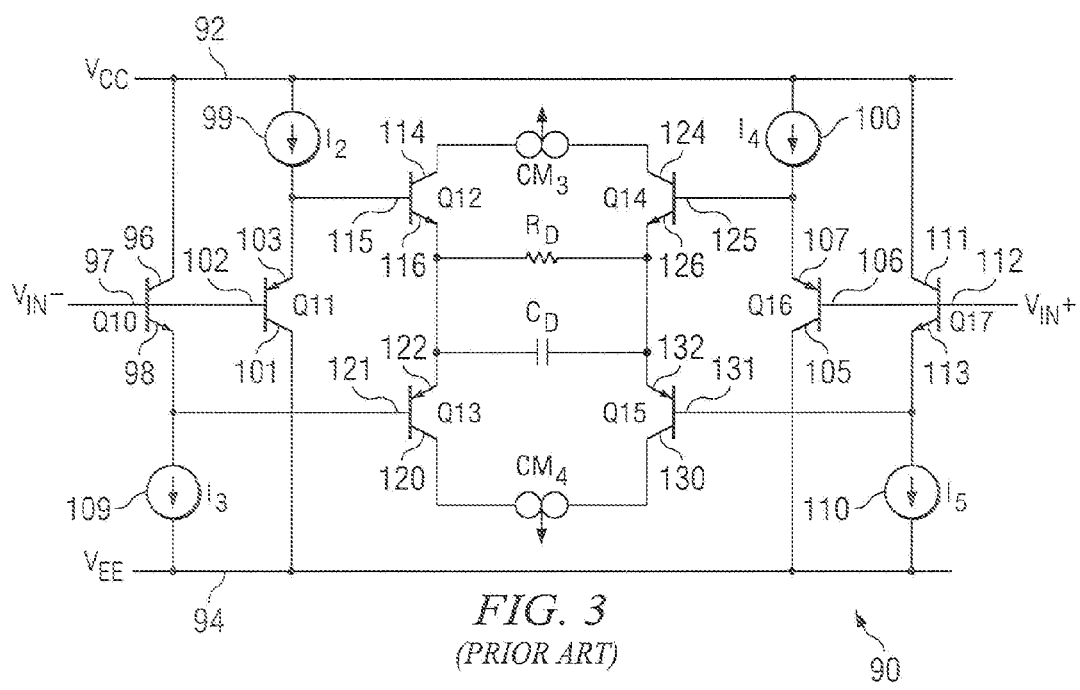
FIG. 3 is an electrical schematic diagram illustrating a representative prior art dynamic bias circuit for a signal treating device.

FIG. 3 is an electrical schematic diagram illustrating a representative prior art dynamic bias circuit for a signal treating device. In FIG. 3, a dynamic bias unit 90 is coupled between an upper supply voltage line or rail 92 and a lower supply voltage line or rail 94. Upper supply voltage line 92 provides an upper supply voltage $V_{CC}$. Lower supply voltage line 94 provides a lower supply voltage $V_{EE}$. An NPN transistor Q10 has a collector 96, a base 97 and an emitter 98. A PNP transistor Q11 has a collector 101, a base 102 and an emitter 103. A PNP transistor Q16 has a collector 105, a base 106 and an emitter 107. An NPN transistor Q17 has a collector 111, a base 112 and an emitter 113. Collectors 96, 111 are coupled with upper voltage supply line 92. Collectors 101, 105 are coupled with lower voltage supply line 94. Emitters 103, 107 are coupled with upper voltage supply line 92 via current supply devices 99, 100. Current supply device 99 provides a current $I_2$. Current supply device 100 provides a current $I_4$. Emitters 98, 113 are coupled with lower voltage supply line 94 via current supply devices 109, 110. Current supply device 109 provides a current $I_3$. Current supply device 110 provides a current $I_5$. Bases 97, 102 are coupled to receive an input signal $V_{IN}-$. Bases 10, 112 are coupled to receive an input signal $V_{IN}+$.

An NPN resistor Q12 has a collector 114, a base 115 and an emitter 116. A PNP resistor Q13 has a collector 120, a base 121 and an emitter 122. An NPN resistor Q14 has a collector 124, a base 125 and an emitter 126. A PNP resistor Q15 has a collector 130, a base 131 and an emitter 132. Base 115 is coupled with emitter 103 and current supply device 99. Base 121 is coupled with emitter 98 and current supply device 109. Base 125 is coupled with emitter 107 and current supply device 100. Base 131 is coupled with emitter 113 and current supply device 110. Collectors 114, 124 are coupled with a current mirror device CM3. Collectors 120, 130 are coupled with a current mirror device CM4. Emitters 116, 122 are coupled together. Emitters 126, 132 are coupled together. A resistor $R_D$ and a capacitor $C_D$ couple emitters 116, 122 with emitters 126, 132.

Dynamic bias unit 90 is described in U.S. Pat. No. 6,710,654; issued Mar. 23, 2004, to Charles Parkhurst and Julio E. Acosta; as a solution for a non-rail-to-rail input stage in a high speed application. Dynamic bias unit 90 improves prior folded cascode operational amplifier by providing extra current to charge the compensation capacitance seen at the high impedance node at the expense of very little extra current used for the class AB dynamic circuit. The noise is not increased because the dynamic current is common to all of the input transistors Q10, Q11, Q16, Q17. As a result, the signal-to-noise ratio is improved.

However, dynamic bias unit 90 still does not permit rail-to-rail operation. An offset from rail voltages $V_{CC}$, $V_{EE}$ is still required at a minimum value of $(V_{be}+V_{cesat})$ from each rail. Voltage $V_{cesat}$ is the collector-to-emitter saturation voltage of transistors incorporated in structure of current source devices 99, 100, 109, 110 (not shown in detail in FIG. 3).

Figure 4:
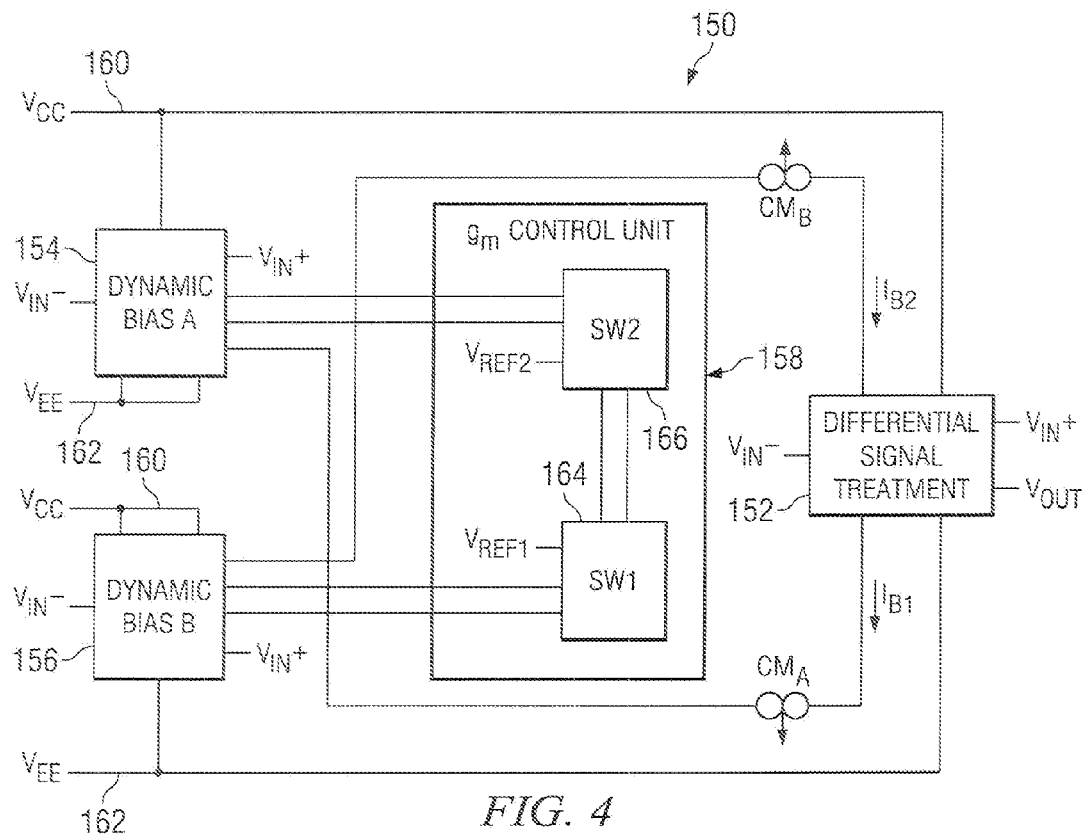
FIG. 4 is a schematic diagram illustrating the apparatus of the present invention.

FIG. 4 is a schematic diagram illustrating the apparatus of the present invention. In FIG. 4, an apparatus 150 is coupled with a signal treating device 152. By way of example and not by way of limitation, signal treating device may be a differential signal operational amplifier.

Apparatus 150 includes two dynamic bias units, a first dynamic bias unit 154, a second dynamic bias unit 156, and a transconductance ($g_m$) control unit 158. First dynamic bias unit 154 is coupled with an upper voltage supply line 160 for receiving an upper supply voltage $V_{CC}$, and is coupled with a lower voltage supply line 162 for receiving a lower supply voltage $V_{EE}$. First dynamic bias unit 154 is coupled for receiving input signals $V_{IN}+$, $V_{IN}-$, and is coupled for receiving tail current $I_{B2}$ from signal treating device 152 via a current mirror $CM_A$. Second dynamic bias unit 156 is coupled with upper voltage supply line 160 for receiving upper supply voltage $V_{CC}$, and is coupled with lower voltage supply line 162 for receiving lower supply voltage $V_{EE}$. Second dynamic bias unit 156 is coupled for receiving input signals $V_{IN}+$, $V_{IN}-$, and is coupled for receiving tail current $I_{B1}$ from signal treating device 152 via a current mirror $CM_B$.

Transconductance (gm) control unit 158 includes a first switching unit 164 coupled with second dynamic bias unit 156 and includes a second switching unit 166 coupled with first dynamic bias unit 154. First switching unit 164 is indirectly coupled with first dynamic bias unit 154 via second switching unit 166 (not shown in detail in FIG. 4). Second switching unit 166 is indirectly coupled with second dynamic bias unit 156 via first switching unit 164 (not shown in detail in FIG. 4). First switching unit 164 operates to steer additional tail current to increase tail current $I_{B2}$ when tail current $I_{B2}$ achieves a predetermined state. Second switching unit 166 operates to steer additional tail current to increase tail current $I_{B1}$ when tail current $I_{B1}$ achieves a predetermined state.

Employment of two dynamic bias units 154, 156 permits differential signal treating device 152 to substantially achieve rail-to-rail operation. Employment of transconductance control unit 158 with respect to both tail currents $I_{B1}$, $I_{B2}$ permits differential signal treating device 152 to present substantially constant transconductance during its rail-to-rail operation in processing fully differential signals.

Figure 5:
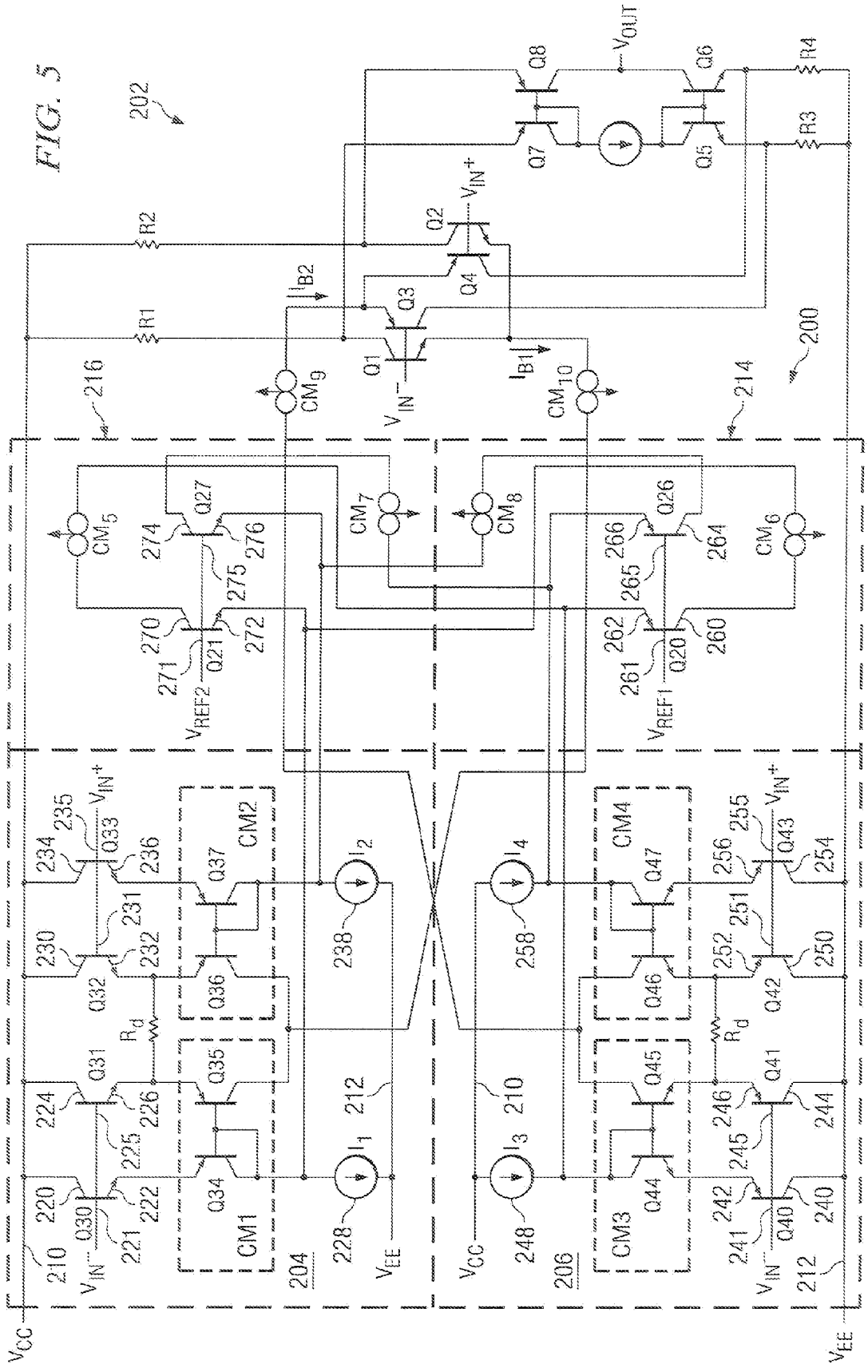
FIG. 5 is an electrical schematic diagram illustrating an embodiment of the apparatus of the present invention.

FIG. 5 is an electrical schematic diagram illustrating an embodiment of the apparatus of the present invention. In FIG. 5, an apparatus 200 is coupled with a fully differential signal treating device 202. Signal treating device 202 is configured substantially similarly to input device 10 (FIG. 1). In the interest of avoiding prolixity, signal treating device 202 will therefore not be described here in detail. One may refer to the description of input device 10 (FIG. 1) for an understanding of signal treating device 202.

Apparatus 200 includes two asymmetric dynamic bias units, a first asymmetric dynamic bias unit 204, a second asymmetric dynamic bias unit 206, and a transconductance ($g_m$) control unit 208. First asymmetric dynamic bias unit 204 is coupled with an upper voltage supply line or rail 210 for receiving an upper supply voltage $V_{CC}$, and is coupled with a lower voltage supply line or rail 212 for receiving a lower supply voltage $V_{EE}$. First asymmetric dynamic bias unit 204 is coupled for receiving input signals $V_{IN}+$, $V_{IN}-$, and is coupled for receiving tail current $I_{B2}$ from signal treating device 202 via a current mirror $CM_1$. Second asymmetric dynamic bias unit 206 is coupled with upper voltage supply line 210 for receiving upper supply voltage $V_{CC}$, and is coupled with lower voltage supply line 212 for receiving lower supply voltage $V_{EE}$. Second asymmetric dynamic bias unit 206 is coupled for receiving input signals $V_{IN}+$, $V_{IN}-$, and is coupled for receiving tail current $I_{B1}$ from signal treating device 202 via a current mirror $CM_2$.

First asymmetric dynamic bias unit 204 is skewed toward lower voltage supply voltage $V_{EE}$. Second asymmetric dynamic bias unit 206 is skewed toward upper voltage supply voltage $V_{CC}$. Operation of an asymmetric dynamic bias unit is described in U.S. Patent Application Publication No. 2004/0212425 by Charles Parkhurst; published Oct. 28, 2004 (hereinafter referred to as "Patent Publication '425").

Operation described in Patent Publication '425 is limited to employment of the device in an asymmetrical dynamically biased amplifier system. Patent Publication '425 does not contemplate using two asymmetric dynamic bias units for rail-to-rail operation of a fully differential signal treating unit.

Transconductance ($g_m$) control unit 208 includes a first switching unit 214 coupled with second asymmetric dynamic bias unit 206 and includes a second switching unit 216 coupled with first asymmetric dynamic bias unit 204. First switching unit 214 operates to steer additional tail current to increase tail current $I_{B2}$ when tail current $I_{B2}$ achieves a predetermined state. Second switching unit 216 operates to steer additional tail current to increase tail current $I_{B1}$ when tail current $I_{B1}$ achieves a predetermined state.

Employment of two asymmetric dynamic bias units 204, 206 permits differential signal treating device 202 to substantially achieve rail-to-rail operation between upper supply voltage $V_{CC}$ and lower supply voltage $V_{EE}$. Employment of transconductance control unit 208 with respect to both tail currents $I_{B1}$, $I_{B2}$ permits differential signal treating device 202 to present substantially constant transconductance during its rail-to-rail operation in processing fully differential signals.

First asymmetric dynamic bias unit 204 is configured similarly to dynamic bias unit 90 (FIG. 3) for dynamic biasing with respect to lower supply voltage $V_{EE}$. An NPN transistor Q30 has a collector 220, a base 221 and an emitter 222. An NPN transistor Q31 has a collector 224, a base 225 and an emitter 226. An NPN transistor Q32 has a collector 230, a base 231 and an emitter 232. An NPN transistor Q33 has a collector 234, a base 235 and an emitter 236. Collectors 220, 224, 230, 234 are coupled with upper voltage supply line 210.

PNP transistors Q34, Q35 are coupled to establish a current mirror CM1. PNP transistors Q36, Q37 are coupled to establish a current mirror CM2. Emitters 222, 226 are coupled with current mirror CM1. Current mirror CM1 is coupled with lower voltage supply line 212 via a current supply device 228. Current supply device 228 provides a current $I_1$. Emitters 232, 236 are coupled with current mirror CM2. Current mirror CM2 is coupled with lower voltage supply line 212 via a current supply device 238. Current supply device 238 provides a current $I_2$.

Second asymmetric dynamic bias unit 206 is configured similarly to dynamic bias unit 90 (FIG. 3) for dynamic biasing with respect to upper supply voltage $V_{CC}$. A PNP transistor Q40 has a collector 240, a base 241 and an emitter 242. A PNP transistor Q41 has a collector 244, a base 245 and an emitter 246. A PNP transistor Q42 has a collector 250, a base 251 and an emitter 252. A PNP transistor Q43 has a collector 254, a base 255 and an emitter 256. Collectors 240, 244, 250, 254 are coupled with lower voltage supply line 212.

NPN transistors Q44, Q45 are coupled to establish a current mirror CM3. NPN transistors Q46, Q47 are coupled to establish a current mirror CM4. Emitters 242, 246 are coupled with current mirror CM3. Current mirror CM3 is coupled with upper voltage supply line 210 via a current supply device 248. Current supply device 248 provides a current $I_3$. Emitters 252, 256 are coupled with current mirror CM4. Current mirror CM4 is coupled with upper voltage supply line 210 via a current supply device 258. Current supply device 258 provides a current $I_4$.

First switching unit 214 includes PNP transistors Q20, Q26. PNP transistor Q20 has a collector 260, a base 261 and an emitter 262. PNP transistor Q26 has a collector 264, a base 265 and an emitter 266. Second switching unit 216 includes NPN transistors Q21, Q27. NPN transistor Q21 has a collector 270, a base 271 and an emitter 272. NPN transistor Q27 has a collector 274, a base 275 and an emitter 276.

PNP transistor Q20 switchingly controls connection of current supply device 248 with current supply device 228 via a current mirror CM6. PNP transistor Q26 switchingly controls connection of current supply device 258 with current supply device 238 via a current mirror CM8. Bases 261, 265 of PNP transistors Q20, Q26 are coupled to receive a reference voltage $V_{REF1}$.

When voltage at emitter 262 goes above voltage $V_{REF1}$, transistor Q20 turns on so that current from current supply device 248 is mirrored for addition to current supply device 228 via a current mirror CM6. When voltage at emitter 266 goes above voltage $V_{REF1}$, transistor Q26 turns on so that current from current supply device 258 is mirrored for addition to current supply device 238 via a current mirror CM8. Currents present at current supply devices 228, 238 are mirrored via current mirrors CM1, CM2 for summed presentation from first asymmetric dynamic bias unit 204. The thus-summed current output of first asymmetric dynamic bias unit 204 is mirrored by a current mirror CM10 for provision to signal treatment device 202 as tail current $I_{B1}$.

NPN transistor Q21 switchingly controls connection of current supply device 228 with current supply device 248 via a current mirror CM5. NPN transistor Q27 switchingly controls connection of current supply device 238 with current supply device 258 via a current mirror CM7. Bases 271, 275 of NPN transistors Q21, Q27 are coupled to receive a reference voltage $V_{REF2}$.

When voltage at emitter 272 goes below voltage $V_{REF2}$, transistor Q21 turns on so that current from current supply device 228 is mirrored for addition to current supply device 248 via a current mirror CM5. When voltage at emitter 276 goes below voltage $V_{REF2}$, transistor Q27 turns on so that current from current supply device 238 is mirrored for addition to current supply device 258 via a current mirror CM7. Currents present at current supply devices 248, 258 are mirrored via current mirrors CM3, CM4 for summed presentation from second asymmetric dynamic bias unit 206. The thus-summed current output of second asymmetric dynamic bias unit 206 is mirrored by a current mirror CM9 for provision to signal treatment device 202 as tail current $I_{B2}$.

First asymmetric dynamic bias unit 204 can operate from voltage $V_{CC}$ to voltage ($V_{EE}+2V_{be}+V_{cesat}$). When first asymmetric dynamic bias unit 204 is not functional, currents $I_1$, $I_2$ are steered through transistors Q20, Q26 to second asymmetric dynamic bias unit 206. Second asymmetric dynamic bias unit 206 can operate from voltage $V_{EE}$ to voltage ($V_{CC}-2V_{be}-V_{cesat}$). When first asymmetric dynamic bias unit 204 is not functional, then currents $I_3$, $I_4$ are steered through transistors Q21, Q27 to first dynamic bias unit 204. When second asymmetric dynamic bias unit 206 is not functional, then currents $I_1$, $I_2$ are steered through transistors Q20, Q26 to second dynamic bias unit 206.

Figure 6:
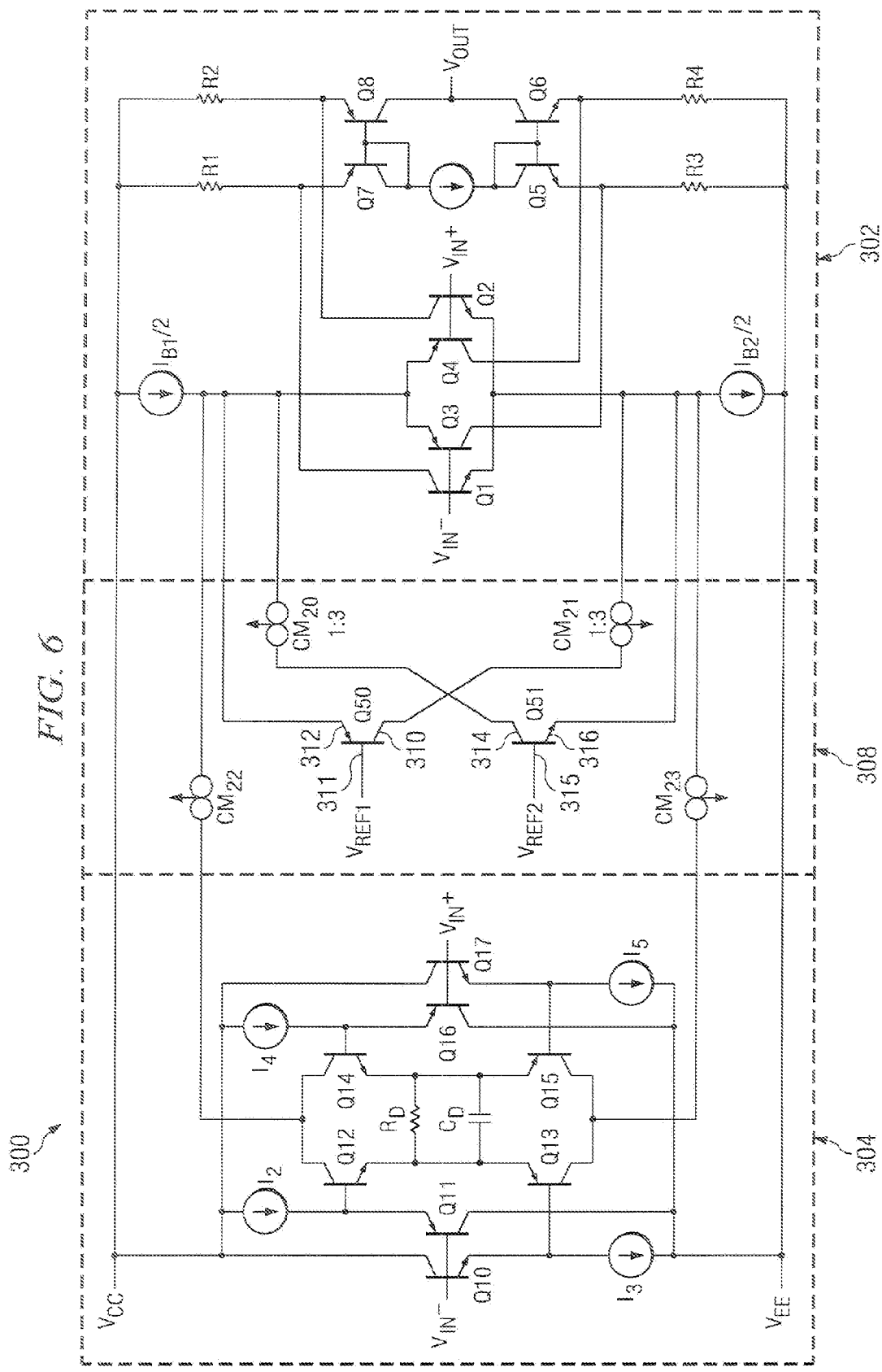
FIG. 6 is an electrical schematic diagram illustrating a preferred embodiment of the apparatus of the present invention.

FIG. 6 is an electrical schematic diagram illustrating a preferred embodiment of the apparatus of the present invention. In FIG. 6, an apparatus 300 is coupled with a fully differential signal treating device 302. Signal treating device 302 is configured substantially similarly to input device 10 (FIG. 1). In the interest of avoiding prolixity, signal treating device 302 will therefore not be described here in detail. One may refer to the description of input device 10 (FIG. 1) for an understanding of signal treating device 302. Signal treating device 302 exhibits tail current $I_{B1}/2$ for transistors Q3, Q4. Signal treating device 302 exhibits tail current $I_{B2}/2$ for transistors Q1, Q2.

Apparatus 300 includes a bias unit 304 and a transconductance ($g_m$) control unit 308. Bias unit 304 is configured substantially similarly to bias unit 90 (FIG. 3). In the interest of avoiding prolixity, bias unit 304 will therefore not be described here in detail. One may refer to the description of bias unit 90 (FIG. 3) for an understanding of bias unit 304.

Transconductance ($g_m$) control unit 308 includes a PNP transistor Q50 and an NPN transistor Q51. Transistor Q50 has a collector 310, a base 311 and a collector 312. Transistor Q51 has a collector 314, a base 315 and an emitter 316. PNP transistor Q50 is coupled for switchingly coupling between transistors Q3, Q4 and transistors Q1, Q2 via a current mirror CM21. Current mirror CM21 mirrors current in a ratio of 1:3 so that current provided to one recipient circuit is three times the amount of current provided to a second recipient circuit. NPN transistor Q51 is coupled for switchingly coupling between transistors Q3, Q4 and transistors Q1, Q2 via a current mirror CM20. Current mirror CM20 mirrors current in a ratio of 1:3 so that current provided to one recipient circuit is three times the amount of current provided to a second recipient circuit.

When voltage at emitter 312 goes above voltage $V_{REF1}$, transistor Q50 turns on so that at least a portion of current $I_{B2}/2$ current from transistors Q1, Q4 is mirrored for addition to current $I_{B1}/2$ current from transistors Q2, Q3 via a current mirror CM21. When voltage at emitter 316 goes below voltage $V_{REF2}$, transistor Q51 turns on so that at least a portion of current $I_{B1}/2$ current from transistors Q2, Q3 is mirrored for addition to current $I_{B2}/2$ current from transistors Q1, Q4 via a current mirror CM20.

Apparatus 300 provides substantially half of bias in a static manner and substantially half of bias in a dynamic manner. Other current mirror ratios than 1:3 may be selected to provide more or less than half of bias in a dynamic manner. In apparatus 300, in the voltage range from $V_{EE}$ to ($V_{EE}+V_{be}$), dynamic bias and NPN differential transistor pair Q1, Q2 shut off. In this configuration, transistor Q51 and current mirror CM20 (with ratio 1:3) cooperate to steer tail current $I_{B2}/2$ for summing with tail current $I_{B1}/2$. In apparatus 300, in the voltage range from $V_{CC}$ to ($V_{CC}-V_{be}$), dynamic bias and PNP differential transistor pair Q3, Q4 shut off. In this configuration, transistor Q50 and current mirror CM21 (with ratio 1:3) cooperate to steer tail current $I_{B1}/2$ for summing with tail current $I_{B2}/2$. Transconductance ($g_m$) is thereby kept substantially constant during rail-to-rail operation of signal treating device 302.

Figure 7:
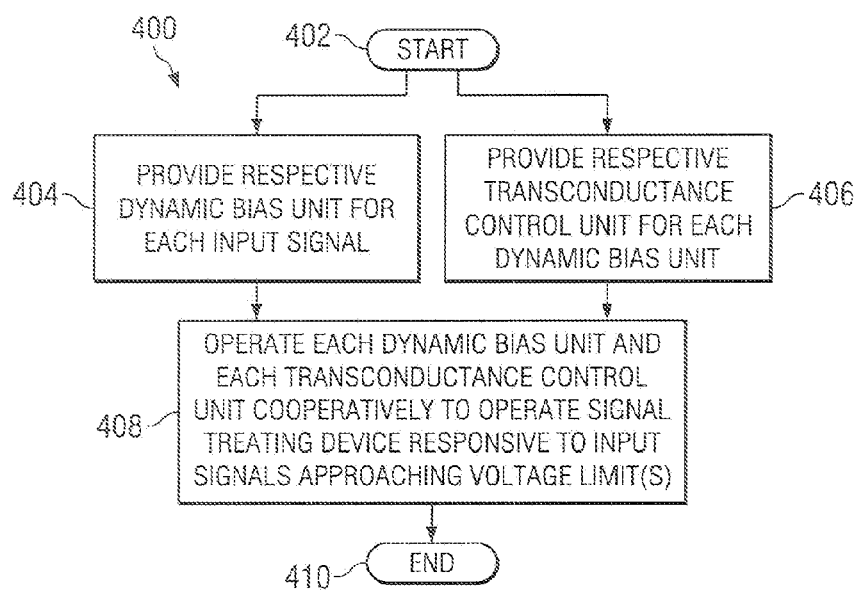
FIG. 7 is a flow chart illustrating the method of the present invention.

FIG. 7 is a flow chart illustrating the method of the present invention. In FIG. 7, a method 400 for affecting operation of a signal treating device begins at a START locus 402. The signal treating device is provided an operating voltage ranging between an upper voltage limit and a lower voltage limit for treating at least one input signal. Method 400 continues with the step of, in no particular order: (1) providing a respective dynamic bias unit coupled with the signal treating device for each respective input signal of the at least one input signal, as indicated by a block 404; and (2) providing a respective transconductance control unit coupled with each respective dynamic bias unit, as indicated by a block 406.

Method 400 continues with the step of operating each respective dynamic bias unit and each transconductance control unit cooperatively to operate the signal treating device responsive to the at least one input signal approaching at least one of the upper voltage limit and the lower voltage limit, as indicated by a block 408. Method 400 terminates at an END locus 410.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus for affecting operation of a signal treating device; said signal treating device being provided an operating voltage ranging between an upper voltage limit and a lower voltage limit for treating at least one input signal; the apparatus comprising a respective dynamic bias unit coupled with said signal treating device for each respective input signal of said at least one input signal; and a respective transconductance control unit coupled with each said respective dynamic bias unit; each said respective dynamic bias unit and said transconductance control unit cooperating to operate said signal treating device responsive to said at least one input signal approaching at least one of said upper voltage limit and said lower voltage limit.

2. An apparatus for affecting operation of a signal treating device as recited in claim 1 wherein each said respective transconductance control unit is comprised of a current steering unit; each said respective current steering unit operating to supplement an operating current of said signal treating device when said operating current varies from a reference current more than a predetermined amount.

3. An apparatus for affecting operation of a signal treating device as recited in claim 1 wherein said at least one input signal is two substantially in-phase mutually inverted input signals; a first input signal of said at least one input signal being treated by a first signal treating section of said signal treating device; a second input signal of said at least one input signal being treated by a second signal treating section of said signal treating device.

4. An apparatus for affecting operation of a signal treating device as recited in claim 3 wherein said first signal treating section is coupled with a first said respective dynamic bias unit, and wherein said second signal treating section is coupled with a second said respective dynamic bias unit.

5. An apparatus for affecting operation of a signal treating device as recited in claim 4 wherein each said respective transconductance control unit is comprised of a respective current steering unit; each said respective current steering unit operating to supplement an operating current of said signal treating device when said operating current varies from a reference current more than a predetermined amount.

6. An apparatus for affecting operation of a signal treating device as recited in claim 1 wherein said signal treating device is a differential signal treating device; said at least one input signal being a differential input signal including a first data signal substantially in-phase with a second data signal; said first data signal and said second data signal being substantially inverted with respect to each other; said differential signal treating device including a first signal treating section for treating said first data signal and a second signal treating section for treating said second data signal.

7. An apparatus for affecting operation of a signal treating device as recited in claim 6 wherein said first signal treating section is coupled with a first said respective dynamic bias unit, and wherein said second signal treating section is coupled with a second said respective dynamic bias unit.

8. An apparatus for affecting operation of a signal treating device as recited in claim 7 wherein each said respective transconductance control unit is comprised of a respective current steering unit; each said respective current steering unit operating to supplement an operating current of said signal treating device when said operating current varies from a reference current more than a predetermined amount.

9. An apparatus for dynamically biasing a signal treating device; said signal treating device operating between an upper voltage limit and a lower voltage limit while treating at least one input signal; the apparatus comprising at least one dynamic bias control unit coupled with said signal treating device; and at least one transconductance control unit coupled with each respective dynamic bias unit of said at least one dynamic bias unit; said at least one dynamic bias unit and said at least one transconductance control unit cooperating to bias said signal treating device responsive to treat said at least one input signal substantially at least one of said upper voltage limit and said lower voltage limit.

10. An apparatus for dynamically biasing a signal treating device as recited in claim 9 wherein each said respective transconductance control unit is comprised of a current steering unit; each said respective current steering unit operating to supplement an operating current of said signal treating device when said operating current varies from a reference current more than a predetermined amount.

11. An apparatus for dynamically biasing a signal treating device as recited in claim 9 wherein said at least one input signal is two substantially in-phase mutually inverted input signals; a first input signal of said at least one input signal being treated by a first signal treating section of said signal treating device; a second input signal of said at least one input signal being treated by a second signal treating section of said signal treating device.

12. An apparatus for dynamically biasing a signal treating device as recited in claim 11 wherein said first signal treating section is coupled with a first said respective dynamic bias unit, and wherein said second signal treating section is coupled with a second said respective dynamic bias unit.

13. An apparatus for dynamically biasing a signal treating device as recited in claim 12 wherein each said respective transconductance control unit is comprised of a respective current steering unit; each said respective current steering unit operating to supplement an operating current of said signal treating device when said operating current varies from a reference current more than a predetermined amount.

14. An apparatus for dynamically biasing a signal treating device as recited in claim 9 wherein said signal treating device is a differential signal treating device; said at least one input signal being a differential input signal including a first data signal substantially in-phase with a second data signal; said first data signal and said second data signal being substantially inverted with respect to each other; said differential signal treating device including a first signal treating section for treating said first data signal and a second signal treating section for treating said second data signal.

15. An apparatus for dynamically biasing a signal treating device as recited in claim 14 wherein said first signal treating section is coupled with a first said respective dynamic bias unit, and wherein said second signal treating section is coupled with a second said respective dynamic bias unit.

16. An apparatus for dynamically biasing a signal treating device as recited in claim 15 wherein each said respective transconductance control unit is comprised of a respective current steering unit; each said respective current steering unit operating to supplement an operating current of said signal treating device when said operating current varies from a reference current more than a predetermined amount.

17. A method for affecting operation of a signal treating device; said signal treating device being provided an operating voltage ranging between an upper voltage limit and a lower voltage limit for treating at least one input signal; the method comprising the steps of:
   (a) in no particular order:
      (1) providing a respective dynamic bias unit coupled with said signal treating device for each respective input signal of said at least one input signal; and
      (2) providing a respective transconductance control unit coupled with each said respective dynamic bias unit; and
   (b) operating each said respective dynamic bias unit and each said transconductance control unit cooperatively to operate said signal treating device responsive to said at least one input signal approaching at least one of said upper voltage limit and said lower voltage limit.

18. A method for affecting operation of a signal treating device as recited in claim 17 wherein said each said respective transconductance control unit is comprised of a current steering unit; each said respective current steering unit operating to supplement an operating current of said signal treating device when said operating current varies from a reference current more than a predetermined amount.

19. A method for affecting operation of a signal treating device as recited in claim 17 wherein said at least one input signal is two substantially in-phase mutually inverted input signals; a first input signal of said at least one input signal being treated by a first signal treating section of said signal treating device; a second input signal of said at least one input signal being treated by a second signal treating section of said signal treating device.

20. A method for affecting operation of a signal treating device as recited in claim 19 wherein said first signal treating section is coupled with a first said respective dynamic bias unit; wherein said second signal treating section is coupled with a second said respective dynamic bias unit; and wherein each said respective transconductance control unit is comprised of a respective current steering unit; each said respective current steering unit operating to supplement an operating current of said signal treating device when said operating current varies from a reference current more than a predetermined amount.

* * * * *